United States Patent [19]
Sippel

[11] Patent Number: 5,539,181
[45] Date of Patent: Jul. 23, 1996

[54] CIRCUIT BOARD

[75] Inventor: Gerhard Sippel, Gaertringen, Germany

[73] Assignee: International Business Machines Corporation, Armonk, N.Y.

[21] Appl. No.: 88,659

[22] Filed: Jul. 6, 1993

[30] Foreign Application Priority Data

Aug. 26, 1992 [EP] European Pat. Off. ............ 92114507

[51] Int. Cl.⁶ ........................................... H05K 1/09
[52] U.S. Cl. ........................................ 174/266; 174/257
[58] Field of Search .................................. 174/257, 261, 174/262, 266

[56] References Cited

U.S. PATENT DOCUMENTS

| | | | |
|---|---|---|---|
| 2,897,409 | 7/1959 | Gitto | 317/101 |
| 3,672,986 | 6/1972 | Schneble et al. | 117/212 |
| 3,799,816 | 3/1974 | Schneble et al. | 156/3 |
| 4,572,925 | 2/1986 | Scarlett | 174/68.5 |
| 4,633,035 | 12/1986 | McMonagle | 174/68.5 |
| 5,001,605 | 3/1991 | Savagian et al. | 361/414 |
| 5,276,290 | 1/1994 | Bladon | 174/262 |
| 5,319,159 | 6/1994 | Wantanabe et al. | 174/262 |

FOREIGN PATENT DOCUMENTS

| | | |
|---|---|---|
| 0160966 | 1/1987 | European Pat. Off. . |
| 0208023 | 1/1987 | European Pat. Off. . |
| 2232908 | 6/1974 | France . |

OTHER PUBLICATIONS

Patent Abstracts of Japan vol. 14, No. 182 Apr. 12, 1990 "Manufacturing of Printed Wiring Board" 2–32589.
Patent Abstracts of Japan vol. 14, No. 22 Jan. 17, 1990 "Manufacturing of Printed Wiring Board" 1–264290.

Primary Examiner—Laura Thomas
Attorney, Agent, or Firm—Michael E. Belk

[57] ABSTRACT

A process with several variants is presented which permits the layer thickness of the conductive layers on a circuit board to be independent of the layer thickness of the conductive layers in the holes. To this end, the surface structure of the circuit board, in particular the conductors, are initially completed, covered with a solder stop mask, and it is only then that the holes bared by exposure and development of the solder stop mask and, if required, lands and pads, are metallized.

30 Claims, 7 Drawing Sheets

CIRCUIT BOARD

FIELD

The invention concerns circuit boards and a process for their fabrication.

BACKGROUND

Hitherto, circuit boards have been fabricated such that what is known as the inner layers, i.e. the conductive regions of the circuit board, are built from horizontal as well as vertical sandwiched insulating layers. For this purpose, various processes may be used which are described, for example, in "Handbuch der Leiterplattentechnik", Vol. 2, 1991, E.G. Leuze Verlag, Saulgau, Germany.

Such a substrate, which is normally fabricated by lamination, is coated either unilaterally and bilaterally with a metal, generally a copper foil.

Subsequently, through and/or blind holes are drilled into the metal-coated substrate and cleaned from drilling residue.

Then the holes in the substrate as well as the surface (full panel plate) or only the image pattern (pattern plate) are generally subjected to an electrodeposition of metal in, say, a copper bath. On the surface, metal is thus deposited on the metal foil, whereas in the holes it is applied directly to the substrate consisting of conductor planes and insulating material.

The substrate surface is blanket-coated with photoresist which is exposed and developed to form a pattern, while the region of the holes is "tented", meaning that the holes are covered with photoresist. Thus, the future conductors are defined in the remaining surface regions.

In the next step, the metal, i.e., the electrodeposited layer and the foil, is removed, for example, by etching, and the photoresist is stripped, retaining the metal protected by "tenting" in the holes and that protected by photoresist in the remaining regions.

In the last step, a solder stop mask is applied to the surface of the substrate, exposed and developed. This may be followed by a test and separating steps.

In this manner circuit boards are obtained, wherein the metal layer thicknesses on the circuit board surface and in the holes are dependent on each other. As a predetermined minimum layer thickness of metal must exist in the holes, this process using thick metal layers on the surface (metal foil and electrodeposited metal) is hardly suitable for fabricating fine-line products such as those with conductor widths of less than about 75 µm (about 3 mil).

SUMMARY OF THE INVENTION

It is the object of the invention to render the metallization of the holes independent of that on the surface.

This object is accomplished according to the invention in that after the holes have been formed in the substrate and prior to depositing the conductive material in the holes, a solder stop mask is applied to the surface of the substrate, exposed and developed.

The novel process permits the fabrication of circuit boards with conductors of a conductive material and with holes coated with a conductive material, wherein the layer thickness of the conductive material on one surface of the circuit board is independently selectable of the layer thickness of the conductive material in the holes.

Thus, fine-line circuit boards may be fabricated, wherein the layer thickness of the conductive material on the surface of the circuit board is about 10 to 40 µm and the layer thickness of the conductive material in the holes and 5 to 30 µm, and wherein the layer thickness of the conductive material on the surface of the circuit board is preferably about 15 to 18 µm and the layer thickness of the conductive material in the holes is preferably about 23 to 28 µm.

The inventive process and several variants are described in detail below with reference to drawings.

DETAILED DESCRIPTION OF THE DRAWINGS

Figure 1A:
FIG. 1A–H is a schematic of a process variant, wherein the hole is formed prior to completion of the conductors.
Figure 1B:
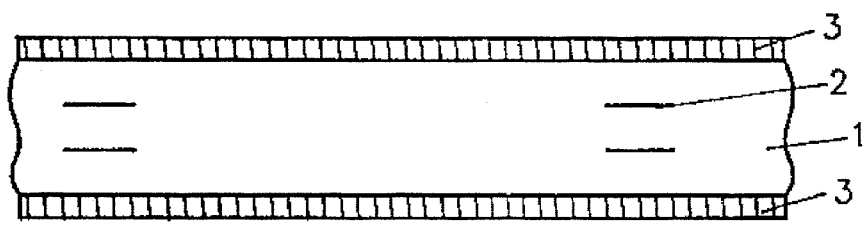
Figure 1C:
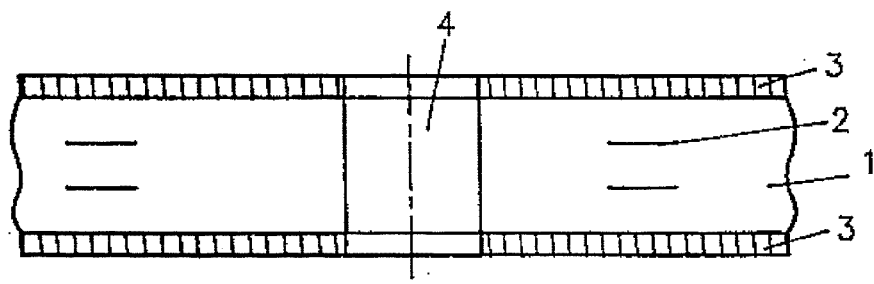
Figure 1D:
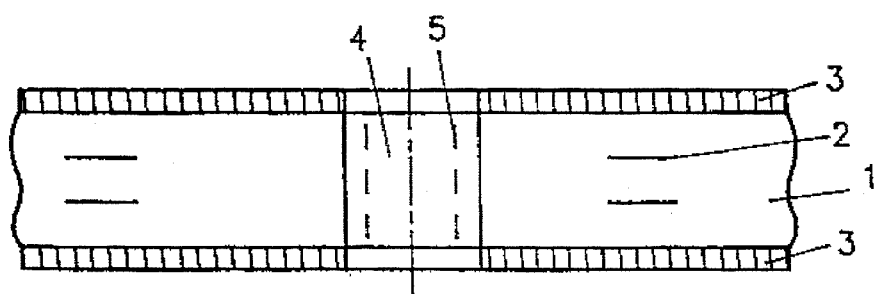
Figure 1E:
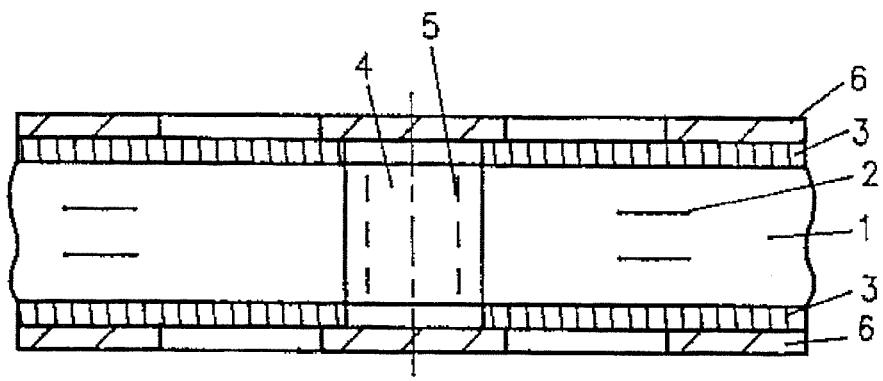
Figure 1F:
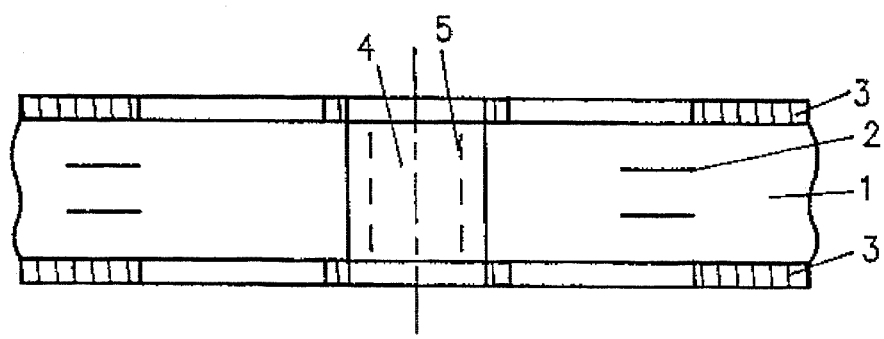
Figure 1G:
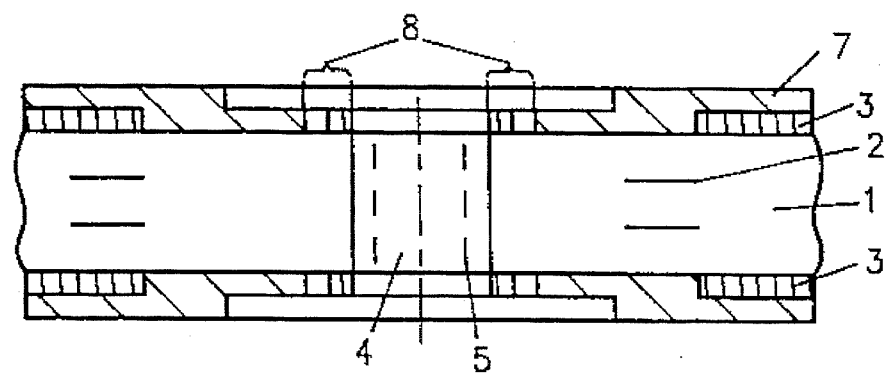
Figure 1H:
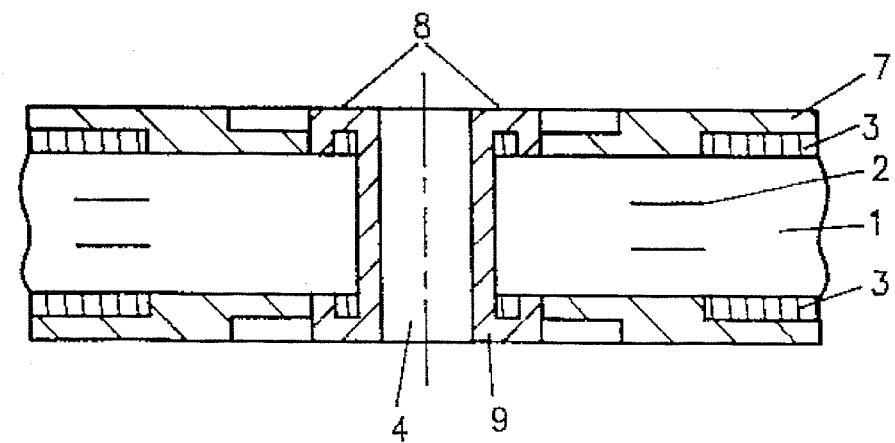
Figure 2A:
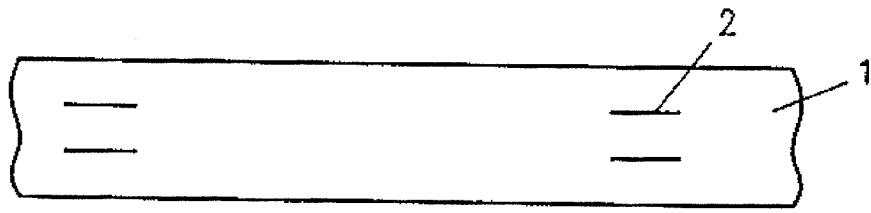
FIG. 2A–H is a schematic of a process variant, wherein the hole is formed after completion of the conductors in a region from which the metal foil has not been removed.
Figure 2B:
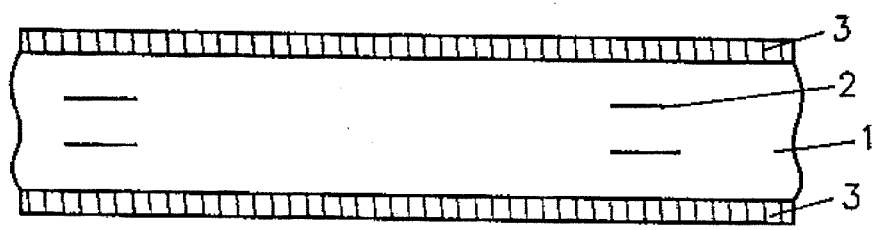
Figure 2C:
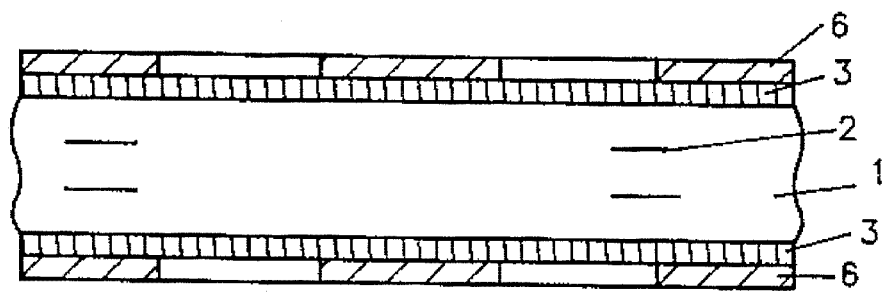
Figure 2D:
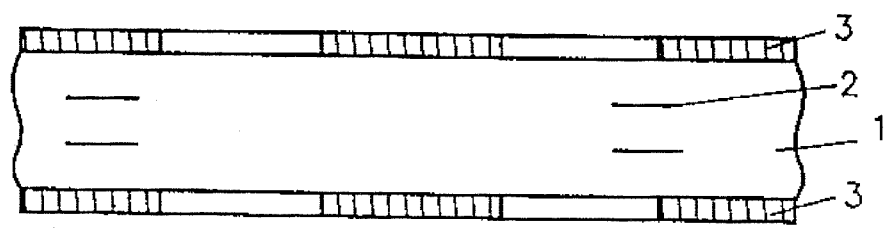
Figure 2E:
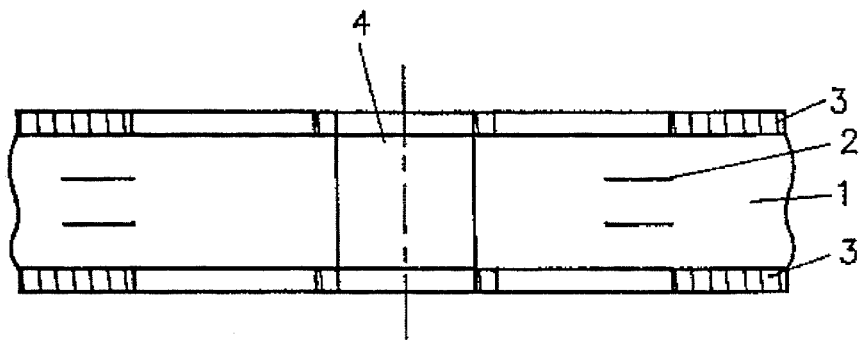
Figure 2F:
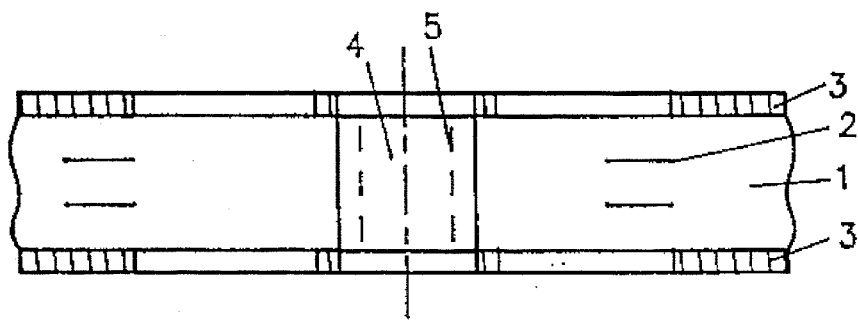
Figure 2G:
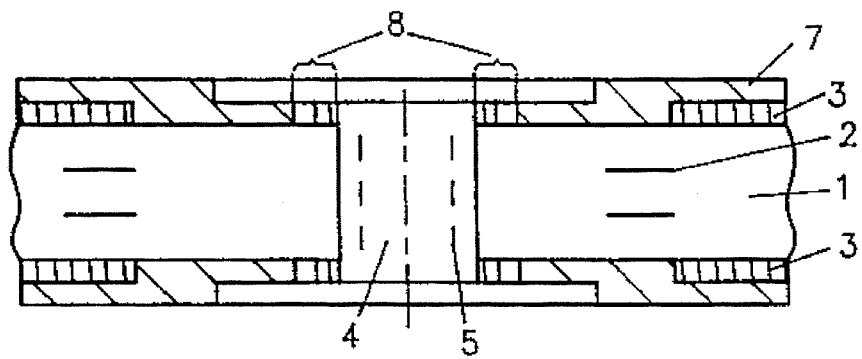
Figure 2H:
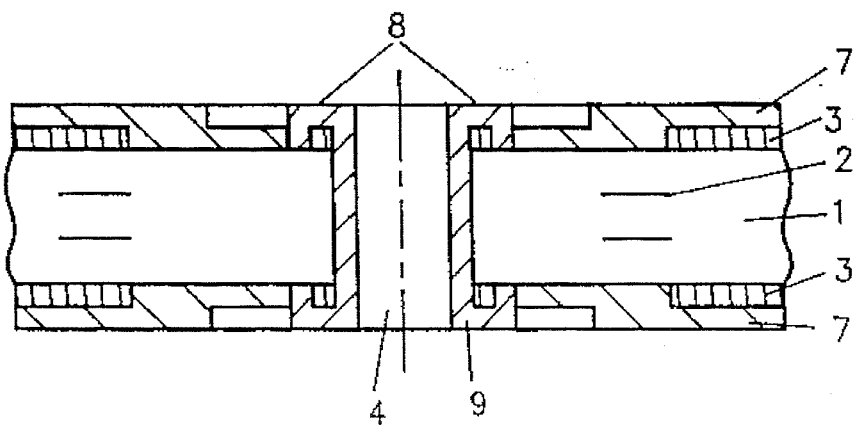
Figure 3A:
FIG. 3A–H is a schematic of a process variant, wherein the hole is formed after completion of the conductors in a region from which the metal foil has been removed.
Figure 3B:
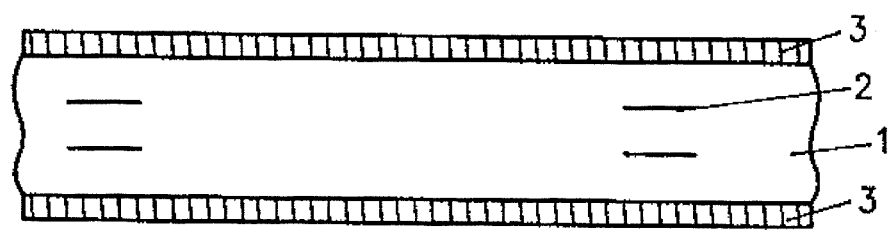
Figure 3C:
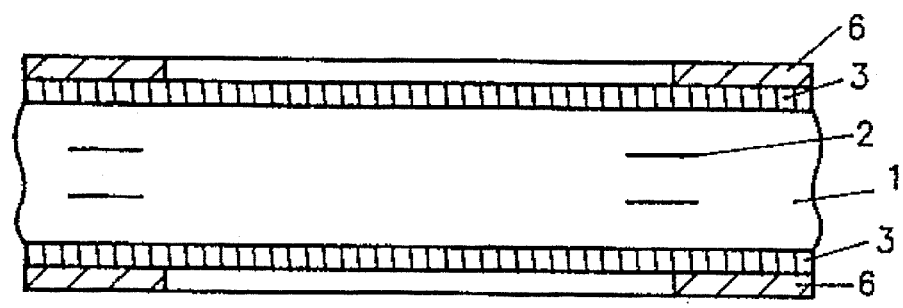
Figure 3D:
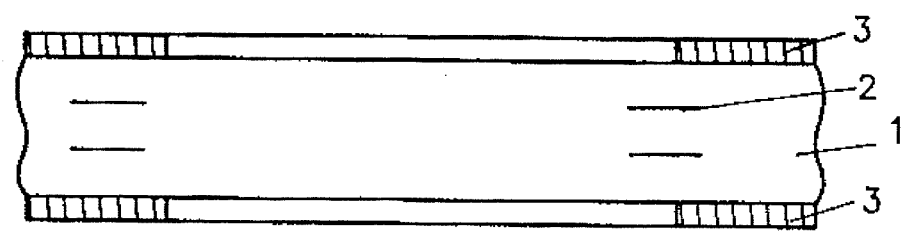
Figure 3E:
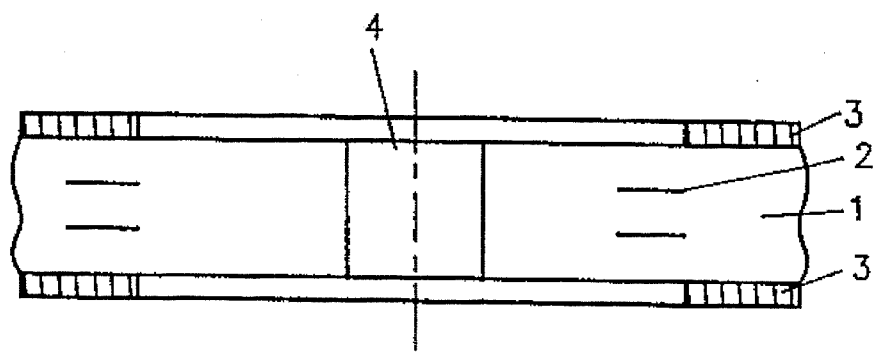
Figure 3F:
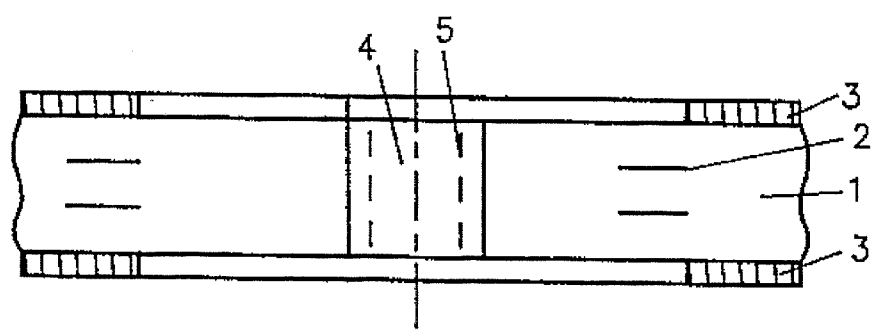
Figure 3G:
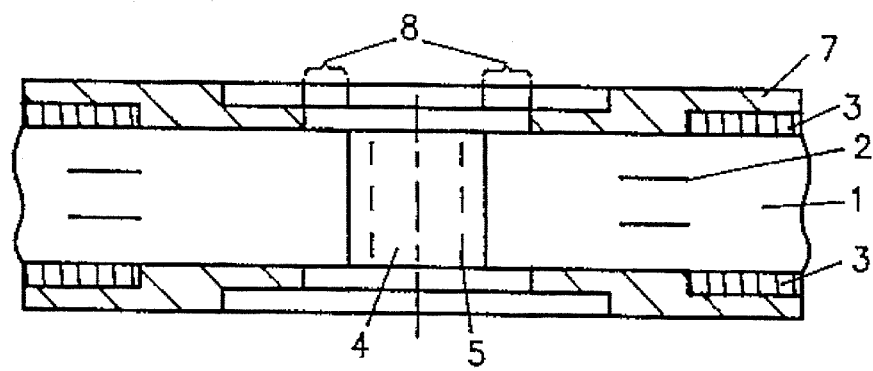
Figure 3H:
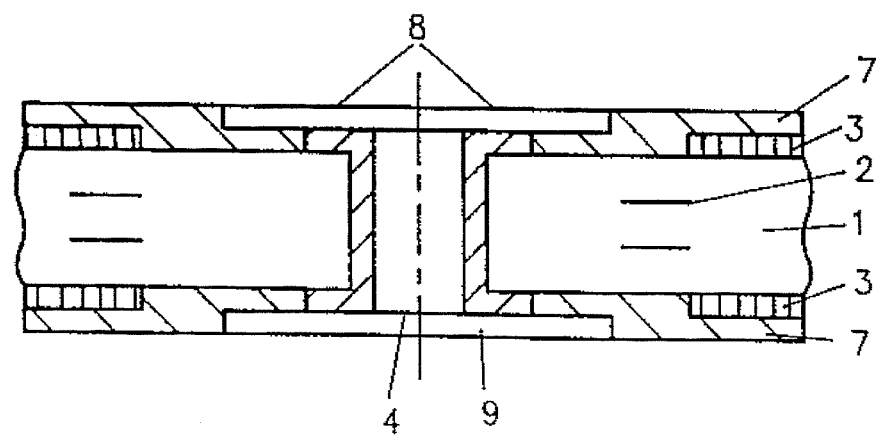

As shown in FIG. 1, the first process variant provides for a substrate 1 with all the inner layers 2 for the circuit board to be fabricated in a known manner by, say, lamination (steps a) and b)). Substrate 1 thus consists of insulating layers (e. g., FR-4, polyimide) and conductive layers (e. g., copper) which may be differently structured. In step b) carried out simultaneously with step a), a metal foil 3, for example, a copper foil, of small thickness, generally less than 40 µm, is deposited, for example, by lamination on one or both surfaces of the substrate 1.

Then (step c) ), holes 4 are formed in the substrate 1, which may be through or blind holes and which serve to connect the conductive layers. The holes may be drilled by mechanical and physical means (such as spiral drills and lasers). Suitable registration methods ensure that the holes 4 are correctly positioned relative to the inner layers 2. The holes are cleaned, for example, by chemical processes.

Then, the holes 4 are treated with a conditioning agent 5, such as gaseous sulphur trioxide, for 1 to 2 minutes at room temperature to be metallized later on (step d)). In response to the reaction between the conditioning agent 5 and the plastic surface, functional groups are formed which permit seeding with palladium nuclei (activation) and chemical metallization at a later stage. Compared with other, metallic, conditioning agents, $SO_3$ has the advantage that it is not electrically active. Consequently, when $SO_3$ is used, electronic effects which may lead to short-circuiting are eliminated in places where the conditioned regions are covered. In addition, the precious metal catalysts, such as $PD^{2+}$, deposited in the activation step, are most effectively bound by $SO_3$, which improves the adhesion of the chemical metallization.

In step e), photoresist 6 is deposited on the substrate surface, for which purpose the holes 4 should be covered (tented). The photoresists employed may be conventional ones, although dry resists, which can be deposited in thin layers and which are suitable for producing fine-line products, are the obvious choice. Using, for example, a mask, photoresist 6 is exposed and developed to form a pattern. Above and around the holes 4, photoresist 6 is retained and in the remaining regions of the substrate surface it defines the future conductors. In this step, too, care must be taken by registration methods that the future conductors are correctly positioned relative to the holes 4 and that the holes are well covered.

Then, using a suitable process, such as an etch process (step f)), metal foil 3 is removed from those regions where no photoresist 6 exists. In addition, photoresist 6 is removed. As a result, the conductor structures are transferred to the metal foil 3 and the contact areas, such as lands (annular contact areas surrounding the holes) and pads (contact areas without holes), are formed on the metal foil 3.

In step g), a solder stop mask 7 is applied to the surface of substrate 1, exposed and developed, removing the solder stop mask in particular above the holes 4 as well as around them in a region 8 comprising at least the metal foil retained there for forming a land. The remaining surface of the substrate 1 is covered by the solder stop mask 7 which may remain there also during later processing steps. Efficient registration must ensure that the holes in the solder stop mask 7 are correctly positioned.

Substrate 1, covered on the surface, with bared hole 4 and metal foil 3 along the hole edge 8 is then ready for metallization 9 which is carried out in step h) . Metallization generally takes place in a chemical metal bath, such as a chemical copper bath, although there are also other metallization processes that may be used for this purpose. Prior to copper plating, for example, it may be advantageous to nickel-plate in a chemical nickel bath, as this improves the adhesion of the metallization 9 to substrate 1.

Such a process permits selecting the thickness of the metallization in the region of the holes 4 independently of that of the conductors. By a combination of additive and subtractive processes, the advantages of both may be combined. Compared with known processes, higher aspect ratios in the holes, i.e. a more uniform metallization also in deeper and smaller holes, are obtained. With copper foils, the variation of the layer thickness on the surface is noticeably smaller than with existing processes, wherein additional metal is applied to a metal foil by electrodeposition. In addition, compared with double layers consisting of a metal foil 3 and a metallization 9, less material is wasted when only the metal foil is structured.

It is also possible to form the holes 4 in substrate 1 only after the conductors on the substrate surface have been completed. This variant is described with reference to FIGS. 2 and 3. Steps a) and b) of the latter two variants—producing a substrate 1 with finished inner layers 2 and applying a metal foil thereto—are identical with steps a) and b) of the first variant.

In step c) of the second variant (FIG. 2), photoresist 6 is applied to the surface of the substrate and exposed, so that, after exposure, photoresist 6 is retained in those regions in which a hole is to be formed later on.

In the following step d), the metal foil 3 is removed from the regions in which no photoresist 6 exists, and photoresist 6 is stripped off. Then, holes 4—through or blind holes— may be formed in substrate 1 (step e)). As previously explained in connection with step c), the second variant provides for holes 4 to be formed in a region where photoresist 6 previously existed and which thus is still coated with metal foil 3.

In step f), analogously to step d) of the first variant, hole 4 is conditioned with a conditioning agent 5.

At the stage of step g) of the second variant, the conditions are the same as those in step g) of the first variant. The remaining process steps are identical.

Accurate registration must be ensured in several process steps, namely, during the fabrication of the conductors which have to be registered relative to the inner layers 2 through holes 4 and when the solder stop mask is bared relative to the position of the holes, pads, etc.

Compared with the first variant, this approach has the advantage that the holes do not have to be tented. As a result, a major error source during the fabrication of circuit boards is eliminated, as the relatively frequent occurrence of broken tents leads to failure and rejects (excessively etched holes).

For the third process variant (FIG. 3), in contrast to the second variant, hole 4 is formed in step e) in a region of the substrate 1 from which metal foil 3 has been stripped. After conditioning (step f)), application of a solder stop mask 7 and metallization 9, which all proceed analogously to those of variant 2, there is no double layer of metal foil 3 and deposited metallization 9 in the region 8 surrounding the edges of the holes but only metallization 9.

This process allows producing all contact faces, such as lands and pads, in metallization step h). It is also suitable for what is known as a "landless design", i.e., for connecting the conductive material of the holes 4 directly to the conductors, which saves a considerable amount of space. Compared with the second variant, variant 3 has the advantage that there is no registration problem when the solder stop mask is bared for the lands. In addition, as all conductive structures on the surface of substrate 1 other than conductors are produced only in the final metallization step, variant 3 offers the possibility of eliminating the elaborate metallization step for components rejected after the critical drilling step.

All three process variants require a solder stop mask 7 which is not electroplated, which does not poison the copper bath and which is not electrolytically infiltrated. The solder stop mask 7 may be, for example, a solder-resistant photoresist, such as epoxy resin that can be photostructured.

Figure 4:
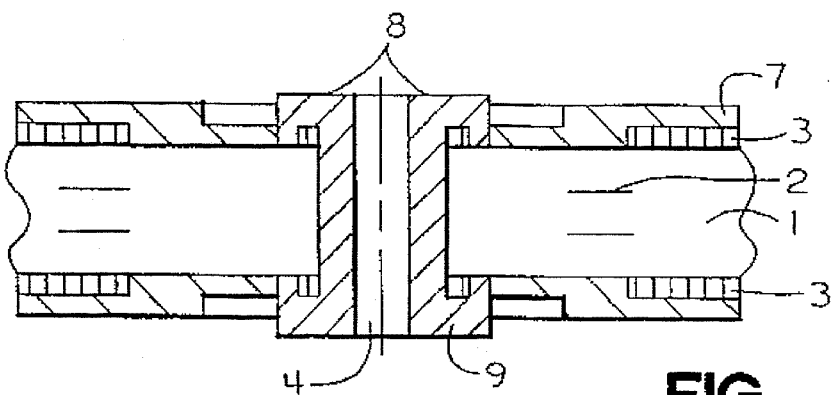
FIG. 4A–D is a schematic of the process variants of the invention of FIGS. 1–3, wherein the thickness of the conductive material deposited in the through hole is independent of the thickness of the conductive metal on the surface of the circuit board.
Figure 4:
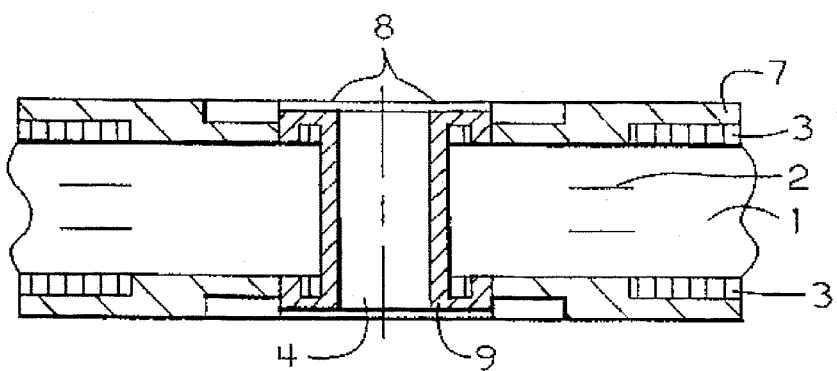
Figure 4:
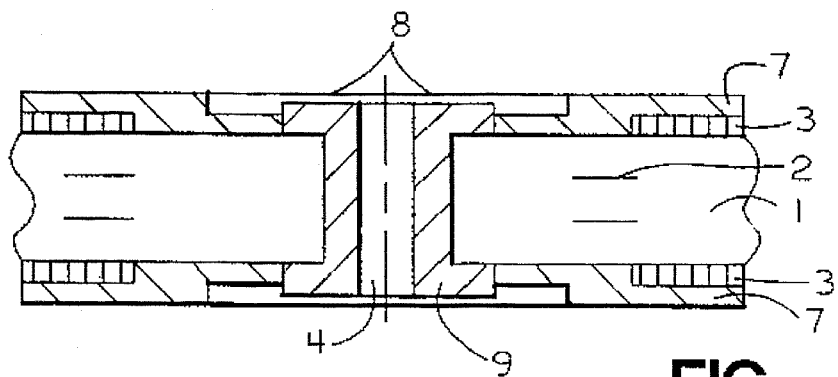
Figure 4:
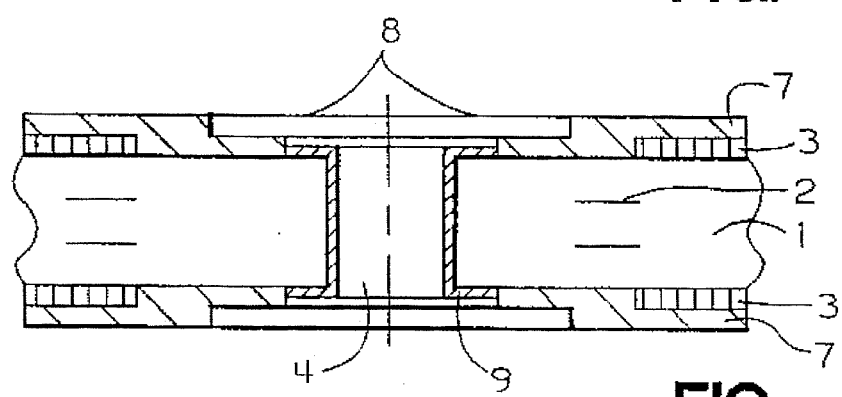

The above-described processes permit the fabrication of circuit boards, wherein the layer thickness of the conductive material on the surface of the circuit board is independently selectable of the layer thickness of the conductive material in the holes. Thus, the layer thickness on the surface no longer has to exceed that in the holes but both are selectable according to technical expedience. This is shown in FIG. 4 where the conductive material 9 deposited in the hole, may be thinner (4B,4D) or thicker (4A,4C) then the conductive material 3 on the circuit board surface. The layer thicknesses of the conductors may range from, say, about 10 to 40 µm and in the holes from about 5 to 30 µm, with the former preferrably being, for example, about 15 to 18 µm and the latter about 23 to 28 µm. This yields superfine conductors on the surface of the circuit board and a good metallization of the holes and may be improved by a "landless" design as per variants 2 and 3, as space savings on the surface increase the wiring density still further.

I claim:

1. An interconnect structure, comprising:

a substrate; and a layer of a conductive material forming conductors on at least one surface of the substrate and coating the walls of holes through the substrate; and in which the layer thickness of the conductive material on the one surface of the substrate is thinner than the maximum layer thickness of the conductive material in the holes.

2. The structure of claim 1, in which the layer thickness of the conductive material on the surface of the substrate is about 10 to 40 µm and the layer thickness of the conductive material in the holes about 5 to 30 µm.

3. The structure of claim 1, in which the layer thickness of the conductive material on the surface of the substrate is about 15 to 18 µm and the layer thickness of the conductive material in the holes is about 23 to 28 µm.

4. The structure of claim 1 in which a majority of the thickness of the conductors is a laminated copper foil.

5. The structure of claim 4 in which a layer of deposited copper covers the copper foil only in a region immediately around the holes.

6. The structure of claim 1 in which a surface conductor is connected directly to the conductive material deposited in one of the holes without an intermediate land.

7. The structure of claim 1 in which conductive material on the surface is coated with a layer of developed photoresist.

8. The structure of claim 7 in which the photoresist is epoxy based.

9. The structure of claim 1, in which:

the conductive material in the holes includes deposited copper;

regions of conductive material on the surface of the structure immediately around the holes include both a layer of laminated copper foil and a layer of deposited copper; and other regions of conductive material on the surface include substantially less deposited copper than in regions immediately around the holes.

10. The structure of claim 9 in which the conductive material of other regions consist essentially of only copper foil.

11. The structure of claim 9, in which the deposited copper has the structure and other physical properties inherently produced by chemical deposition.

12. The structure of claim 9, in which a layer of deposited nickel extends between the layers of laminated copper foil and deposited copper.

13. The structure of claim 12, in which the deposited nickel has the structure and other physical properties inherently produced by chemical deposition.

14. The structure of claim 9 in which in the regions immediately around the holes, the deposited layer extends on top of the laminated layer.

15. The structure of claim 1, in which:

the conductive material in the holes and in regions immediately around the holes consists only of deposited metal; and other regions of conductive material on the surface include a metal foil.

16. The structure of claim 15, in which:

both the deposited metal and the metal foil include copper; and the other regions of conductive material consist only of metal foil.

17. The structure of claim 1 in which:

the conductors of conductive material on the one surface remote from the holes include a first layer of laminated foil and a second layer of deposited material; and the thickness of the second layer is different than the thickness of the conductive material of the holes.

18. The structure of claim 1 in which the conductors of conductive material on the one surface consist essentially of an etched copper foil layer laminated to the one surface.

19. An interconnect structure, comprising:

a substrate;

a layer of conductors on a surface of the substrate;

conductive material coating holes in the substrate; and connectors on a surface of the substrate immediately around the holes and including a layer of laminated copper foil covered by a layer of deposited copper; and in which:

the layer of conductors includes the copper foil laminate covered by deposited copper that is substantially less thick then the deposited copper of the connectors.

20. The substrate of claim 19, in which the conductors further include a layer of deposited nickel, between the copper foil laminate and deposited copper, in the regions immediately around the holes.

21. The structure of claim 20 in which the deposited nickel has the structure and other physical properties inherently produced by chemical deposition.

22. The structure of claim 19 in which the deposited copper has the structure and other physical properties inherently produced by chemical deposition.

23. The structure of claim 19 in which the thickness of the conductors is independent of the thickness of conductive material in the holes.

24. The structure of claim 19, in which other regions of conductive material consist only of copper foil with no copper deposited thereon.

25. An interconnect structure, comprising:

a substrate;

a conductive material on the surface of the substrate forming conductors and coating walls of holes through the substrate;

in which:

the conductive material in holes and regions of the surface of the substrate immediately around the holes consist only of deposited copper; and other regions of conductive material on the surface include patterned copper foil laminate with substantially less thickness of deposited copper than immediately around the holes.

26. An interconnect structure, comprising:

a substrate;

surface conductors of copper foil;

deposited copper coating holes through the substrate and extending over the copper foil only in regions immediately around the holes; and a layer of deposited nickel extending between the copper foil and the deposited copper immediately around the holes.

27. An interconnect structure comprising:

surface conductors consisting essentially of etched laminated foil on a surface of the board; and via conductors consisting essentially of chemically deposited conductive material extending through holes through the board, connected to the foil conductors;

and in which the maximum thickness of the chemically deposited material is thicker than the foil.

28. The structure of claim 27 in which both the foil and deposited materials include copper.

29. The structure of claim 27 in which the chemically deposited material has a structure inherently produced by electrochemical plating.

30. The structure of claim 27 in which the deposited material of a hole extends onto the substrate to form a land around the hole and a foil conductor is connected to the land to connect to the deposited material of the hole.

* * * * *